(12) United States Patent
Cok

(10) Patent No.: US 8,390,008 B2
(45) Date of Patent: Mar. 5, 2013

(54) LED DEVICE STRUCTURE TO IMPROVE LIGHT OUTPUT

(75) Inventor: Ronald S. Cok, Rochester, NY (US)

(73) Assignee: Global OLED Technology LLC, Wilmington, DE (US)

( * ) Notice: Subject to any disclaimer, the term of this patent is extended or adjusted under 35 U.S.C. 154(b) by 323 days.

(21) Appl. No.: 12/128,736

(22) Filed: May 29, 2008

(65) Prior Publication Data

US 2009/0294785 A1 Dec. 3, 2009

(51) Int. Cl.
*H01L 29/72* (2006.01)

(52) U.S. Cl. ............ 257/98; 257/59; 313/498; 313/510; 313/504; 313/512; 358/1.9

(58) Field of Classification Search .............. 257/59, 257/98; 313/498, 510, 504, 512; 358/1.9
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,834,893 A | 11/1998 | Bulovic et al. | |
| 6,091,195 A | 7/2000 | Forrest et al. | |
| 6,711,200 B1* | 3/2004 | Scherer et al. | 372/64 |
| 6,831,407 B2 | 12/2004 | Cok | |
| 2001/0033136 A1* | 10/2001 | Kawase | 313/506 |
| 2004/0217702 A1* | 11/2004 | Garner et al. | 313/512 |
| 2006/0186802 A1 | 8/2006 | Cok et al. | |
| 2007/0057263 A1 | 3/2007 | Kahen | |
| 2007/0201056 A1* | 8/2007 | Cok et al. | 358/1.9 |

FOREIGN PATENT DOCUMENTS

| | | |
|---|---|---|
| EP | 0 969 699 B1 | 1/2003 |
| EP | 1 411 561 A2 | 4/2004 |
| WO | 0237568 | 5/2002 |

OTHER PUBLICATIONS

Safonov et al, Modification of polymer light emission by lateral microstructure, Synthetic Metals 116, 2001, pp. 145-148.
Lupton et al, Bragg scattering from periodically microstructured light emitting diodes, Appl. Phys. Lett. vol. 77, No. 21, Nov. 20, 2000, pp. 3340-3342.
Tsutui et al, Sharply directed emission in organic electroluminescent diodes with an optical-microcavity structure, Appl. Phys. Lett. 65, No. 15, Oct. 10, 1994, pp. 1868-1870.

* cited by examiner

*Primary Examiner* — Edward Wojciechowicz
(74) *Attorney, Agent, or Firm* — McKenna Long & Aldridge, LLP

(57) ABSTRACT

A light-emitting device, including a substrate; a LED element formed over the substrate including a transparent or semi-transparent electrode, a reflective electrode, and one or more layers, at least one of which is light-emitting, formed between the transparent or semi-transparent electrode and reflective electrode, the transparent or semi-transparent electrode and reflective electrode defining a single, controllable light-emitting area, wherein the LED element emits light into a waveguide defined by the transparent or semi-transparent electrode, reflective electrode, and the one or more layers; and one or more first topographical features and one or more second topographical features different from the first topographical features formed over the substrate within the single, controllable light-emitting area, wherein the first and second topographical features disrupt the waveguiding of light within the single, controllable light-emitting area to increase the emission of light in at least one direction.

17 Claims, 9 Drawing Sheets

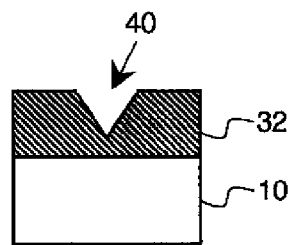
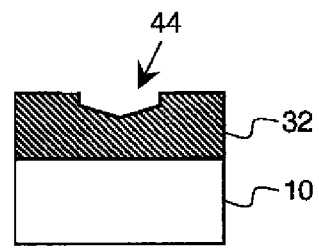
FIG. 4A  FIG. 4B
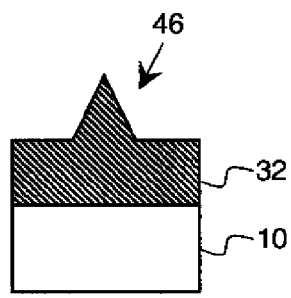
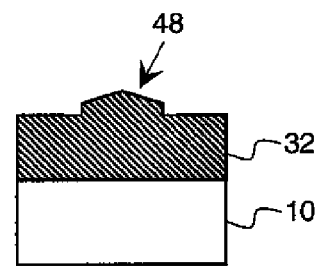
FIG. 5A  FIG. 5B

LED DEVICE STRUCTURE TO IMPROVE LIGHT OUTPUT

FIELD OF THE INVENTION

The present invention relates to improving the light output from a light-emitting device (LED).

BACKGROUND OF THE INVENTION

Planar, area-light emitting diode devices, both organic and inorganic are a promising technology for flat-panel displays and area illumination lamps. The technology relies upon thin-film layers of materials coated over an area upon a substrate. Such LED devices can include, for example, organic light-emitting diode (OLED) materials such as are described in U.S. Pat. No. 4,769,292, to Tang et al., U.S. Pat. No. 5,061,569, to VanSlyke et al., or quantum dots in a polycrystalline semiconductor matrix such as are described in US Publication 2007/0057263 by Kahen.

However, as is well known, much of the light output from the light-emissive layer in an LED is absorbed within the device. Because the light emission from thin-film LEDs tends to be Lambertian, light is emitted equally in all directions so that some of the light is emitted directly from the device, some is emitted into the device and is either reflected back out or is absorbed, and some of the light is emitted laterally, trapped, and ultimately absorbed by the various high-optical-index layers within the device. In general, up to 80% of the light can be lost in this manner.

A variety of techniques have been proposed to improve the out-coupling of light from thin-film light-emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145-148; and "Bragg scattering from periodically microstructured light emitting diodes" by Lupton et al., Applied Physics Letters, Vol. 77, No. 21, Nov. 20, 2000, pp. 3340-3342. Brightness-enhancement films having diffractive properties and surface and volume diffusers are described in WO 0237568 A1 by Chou et al. The use of micro-cavities and scattering techniques is also known; for example, see "Sharply directed emission in organic electroluminescent diodes with an optical-microcavity structure" by Tsutsui et al., Applied Physics Letters 65, No. 15, Oct. 10, 1994, pp. 1868-1870 and commonly-assigned U.S. Patent Application Publication No. 2006/0186802 by Cok et al. However, these approaches are limited in the amount of trapped light extracted, tend to create an unacceptable angular dependency on luminance or color, or disturb the polarization of incident light rendering circular polarizers ineffective, thereby compromising the performance of thin-film LED displays.

Reflective structures surrounding a light-emitting area or pixel are described in U.S. Pat. No. 5,834,893 to Bulovic et al. and describes the use of angled or slanted reflective walls at the edge of each pixel. Similarly, Forrest et al. describe pixels with slanted walls in U.S. Pat. No. 6,091,195. These approaches use reflectors located at the edges of the light-emitting areas. However, considerable light is still lost through absorption of the light as it travels laterally through the layers parallel to the substrate within a single pixel or light-emitting area.

U.S. Pat. No. 6,831,407 by Cok describes the use of a single type of topographical feature in a light-emitting device. However, the design described therein is also subject to light emission having a frequency and angular dependence that can be problematic for broadband emitters employed, for example, in devices employing a single, white-light emitting layer.

SUMMARY OF THE INVENTION

It is an object of the present invention to provide a light-emitting device having a structure that improves light output, provides improved color, and reduces angular dependence of the device.

This object is achieved by providing a light-emitting device, comprising:

(a) a substrate;

(b) a LED element formed over the substrate including a transparent or semi-transparent electrode, a reflective electrode, and one or more layers, at least one of which is light-emitting, formed between the transparent or semi-transparent electrode and reflective electrode, the transparent or semi-transparent electrode and reflective electrode defining a single, controllable light-emitting area, wherein the LED element emits light into a waveguide defined by the transparent or semi-transparent electrode, reflective electrode, and the one or more layers; and (c) one or more first topographical features and one or more second topographical features different from the first topographical features formed over the substrate within the single, controllable light-emitting area, wherein the first and second topographical features disrupt the waveguiding of light within the single, controllable light-emitting area to increase the emission of light in at least one direction.

The present invention has the advantage that it increases the light output from a thin-film LED device, improves the white point of white-light emitters, and reduces frequency and angular dependence of the light output.

BRIEF DESCRIPTION OF THE DRAWINGS

FIGS. 4A and 4B are cross sections of topographical features constructed as indentations according to embodiments of the present invention;

FIGS. 5A and 5B are cross sections of topographical features constructed as extrusions according to embodiments of the present invention;

It will be understood that the figures are not to scale since the individual layers are too thin and the thickness differences of various layers too great to permit depiction to scale.

DETAILED DESCRIPTION OF THE INVENTION

According to the present invention, a plurality of topographical features having different structures are employed in a thin-film, planar, area-light-emitting diode device such as, for example, an organic or inorganic LED. As used herein, a thin-film, planar, area-light-emitting diode device is one having a first planar electrode formed over a substrate, at least one light-emitting layer formed over the first planar electrode area, and a second, planar electrode formed over the light-emitting layer. Upon the application of a suitable voltage differential between the electrodes, current flows through the light-emitting layer to emit light over the area through which current flows.

Figure 1:
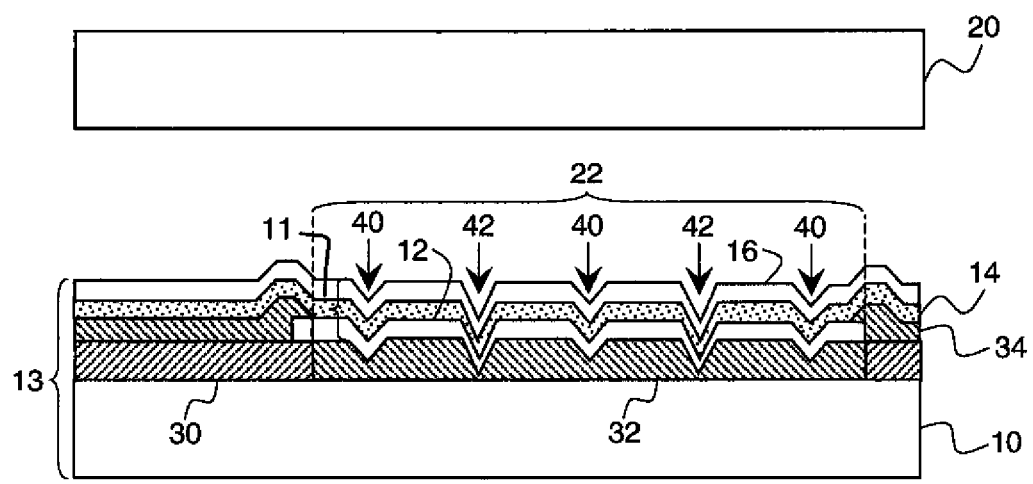
FIG. 1 is a partial cross section of an LED device according to an embodiment of the present invention.

The different topographical features in the present invention serve to extract trapped light in a thin-film LED device and, in combination, improve the color of light output, especially for white-light emission, and reduce color and luminance shift with angle. Referring to FIG. 1, in one bottom-emitting embodiment of the present invention, a thin-film LED light-emitting device includes a substrate 10, an LED element 11 formed over the substrate 10 including a transparent or semi-transparent electrode 12, a reflective electrode 16, and one or more thin-film layers 14, at least one of which is light-emitting, formed between the transparent or semi-transparent electrode 12 and reflective electrode 16. The transparent or semi-transparent electrode 12 and reflective electrode 16 define a single, controllable light-emitting area 22, wherein the LED element 11 emits light into a waveguide 13 defined by the transparent or semi-transparent electrode 12, reflective electrode 16, one or more layers 14 and possibly the substrate 10 (or a cover 20). First topographical features 40 and second topographical features 42 different from the first topographical features 40 are formed over the substrate 10 within the single, controllable light-emitting area 22, so that the first and second topographical features, 40, 42 disrupt the wave-guiding of light within the single, controllable light-emitting area 22.

The features can extend into one or more of the layers in which light is trapped. Typically, an underlying layer, for example a substrate, an otherwise planarizing layer, or an insulating layer made of at least partially transparent materials such as glass, silicon dioxide, silicon nitride, or resin, can have a structure formed within the layer. Subsequent thin-film layers, for example the organic light-emitting layers or charge-control layers will then have a corresponding structure. The various layers and underlying structure form a topographical feature. These topographical features can have a variety of shapes, for example triangular, trapezoidal, or hemispherical. However, according to the present invention, at least two different features or at least two different arrangements of features, must be employed in a single, controllable area. When trapped light that waveguides through the layers encounters the topographical features, the light is reflected, refracted, or diffracted at a different angle to the substrate to increase the emission of light in at least one direction By single, controllable light-emitting area is meant a light-emitting area that cannot be controlled to emit light over only a portion of the area so that either all or none of the area emits light. The cover 20 can be located over the substrate 10 to protect the LED element 11. The waveguide 13 can also include the substrate 10 or cover 20, or any other layers in the LED device, if they are transparent and light is trapped within them.

Thin-film electronic components 30 (e.g. transistors, capacitors) can be formed over the substrate 10, in an active-matrix configuration, together with an insulating layer 32. A separate insulating layer 34 can be formed to electrically insulate patterned electrodes (e.g. 12) from each other. Alternatively, a passive-matrix configuration can be employed using bus lines to provide current rather than transistors with control signals. Active- and passive-matrix designs are well known in the display art and either embodiment can be used in the present invention.

As used herein, a topographical feature (e.g. 40, 42) is an optical structure within a single, controllable, thin-film light-emitting area (e.g. 22) of the LED device on which the electrodes 12, 16, and thin-film layers 14 can be formed to form a non-planar surface that disturbs the wave-guiding of light in the light-emitting element 11 so that the waveguide becomes leaky and wave-guided light is emitted. Preferably, the topographical features 40, 42 do not create a diffractive effect. In one embodiment, an insulating layer (e.g. 32) can be structured (e.g. through photolithographic etching or masked deposition) to form a surface on which the electrodes 12, 16, and thin-film layers 14 can be conformally coated. Structural features such as insulating element 34 are not topographical features as employed herein because they are between and separate light-emitting areas 22 from each other and are not present within the light-emitting area 22.

In one embodiment of the present invention, the light-emitting element 11 is a bottom-emitter (as shown in FIG. 1) so that the substrate 10 is transparent and light is emitted through the transparent or semi-transparent electrode 12 and substrate 10, while the reflective electrode 16 is formed on the side of the transparent or semi-transparent electrode 12 opposite the substrate 10. In an alternative embodiment of the present invention, the light-emitting element 11 can be a top-emitter so that the cover 20 is transparent and the locations of the transparent or semi-transparent electrode 12 and reflective electrode 16 are exchanged. In this embodiment, light is emitted through the cover 20. In alternative embodiments of the present invention (not shown), the reflective electrode 16 can instead be transparent or semi-transparent and light can, or cannot, be emitted through the electrode 16 as well as the electrode 12. In the case in which one electrode is semi-transparent (e.g. electrode 12) and the other is reflective (e.g. electrode 16), the thin-film layers in the light-emitting device can form a microcavity. For example the semi-transparent electrode can include a thin metal layer, e.g. silver deposited by evaporation. In the case in which one electrode is transparent (e.g. electrode 12), it has been found that optical interference still has a significant effect in the frequency and distribution of light output from the LED device. This interference effect is particularly notable in the top-emitter configuration in which a low-index layer (e.g. gas) can be present between the cover 20 and the transparent or semi-transparent electrode 12 (whose location, in this top-emitter embodiment, is exchanged with reflective electrode 16 shown in FIG. 1).

In various embodiments of the present invention, the LED device is a display device having a plurality of individually addressable light-emitting pixels and the single, controllable light-emitting area 22 is a sub-pixel. Alternatively, the LED device of the present invention can be an area illumination device or lamp. In some such embodiments, the light emitted from the single, controllable light-emitting area 22 is broadband, for example white, nearly white, located near the Planckian locus, or includes light of at least two different colors.

The thin-film layers 14 can include one or more light-emitting organic layers or one or more of the light-emitting layers 14 include one or more inorganic layers having quantum dots within a polycrystalline semiconductor matrix. Alternatively, the thin-film layers 14 can include both organic and inorganic materials. The thin-film layers 14 can also include multiple light-emitting layers or charge-control layers such as hole-injection, hole-transport, electron-injection, electron-transport, or charge-blocking layers.

Figure 2A:
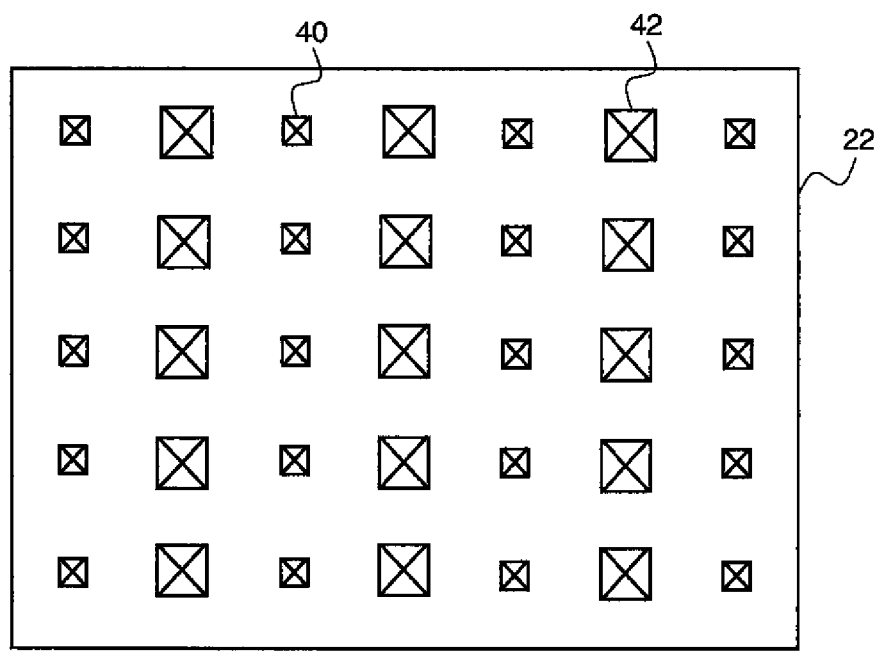
FIGS. 2A-2F are plan views of various topographical feature arrangements useful for LED devices according various embodiments of the present invention.
Figure 2B:
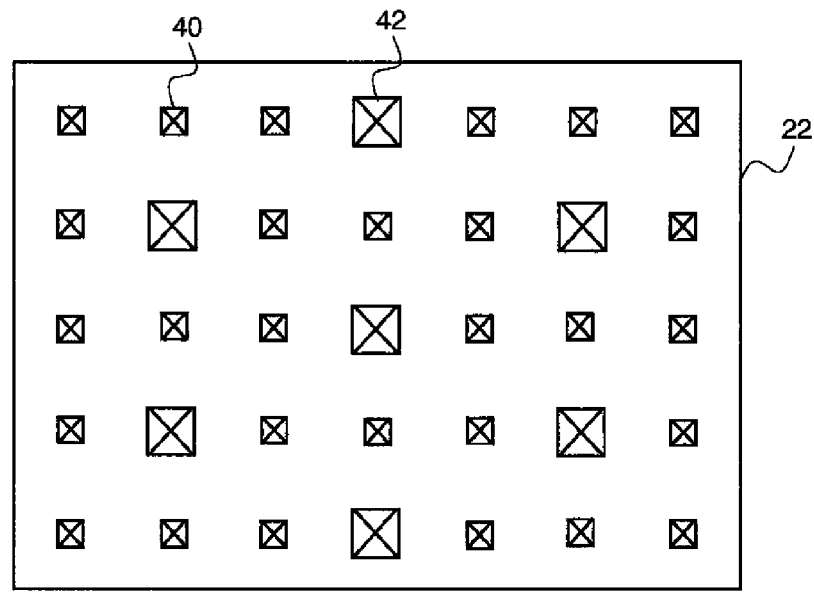
Figure 2C:
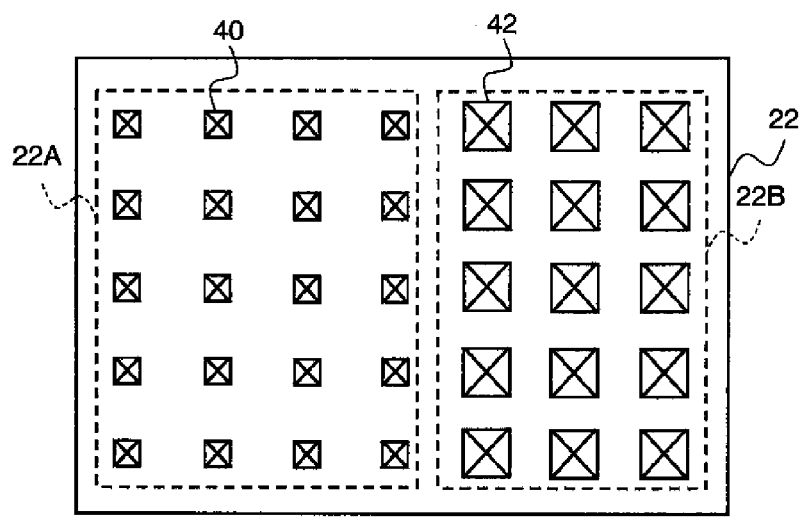
Figure 2D:
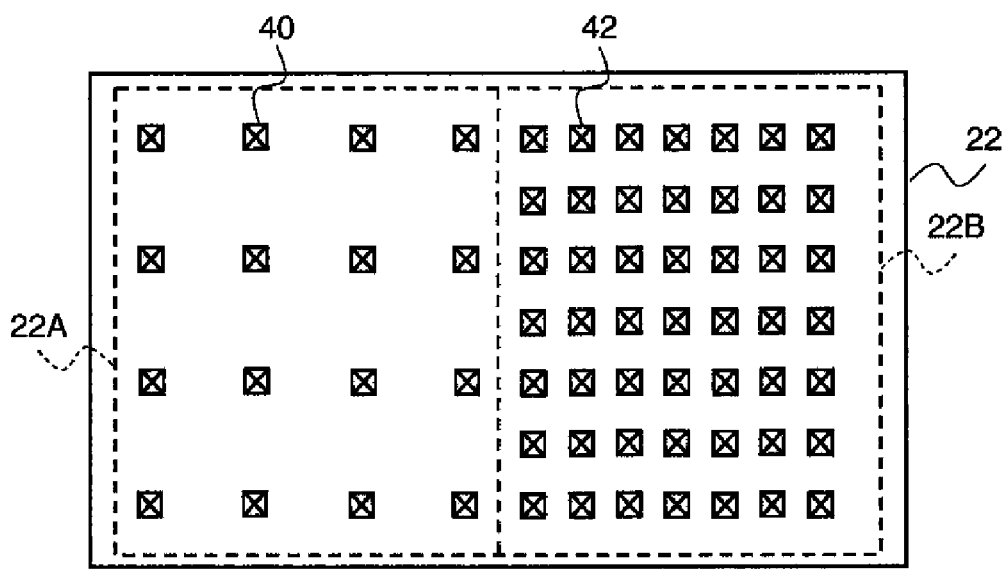
Figure 2E:
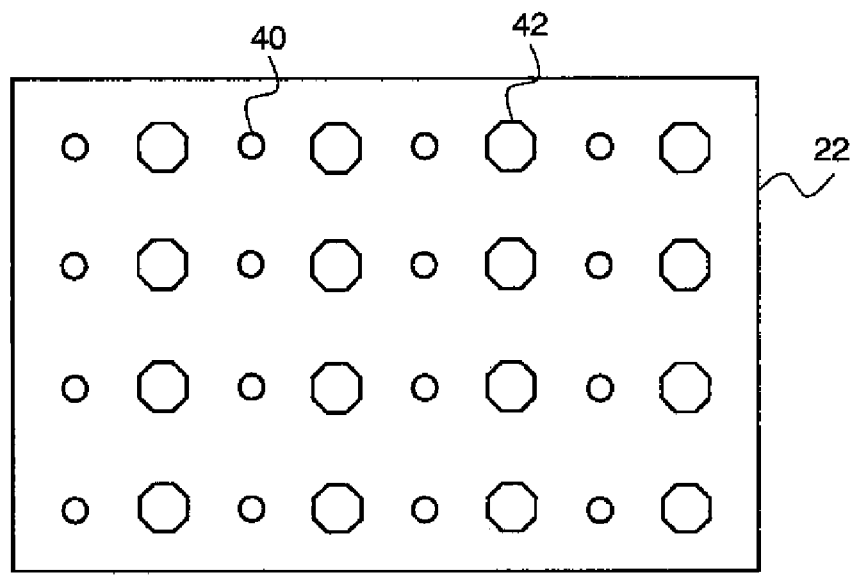
Figure 2F:
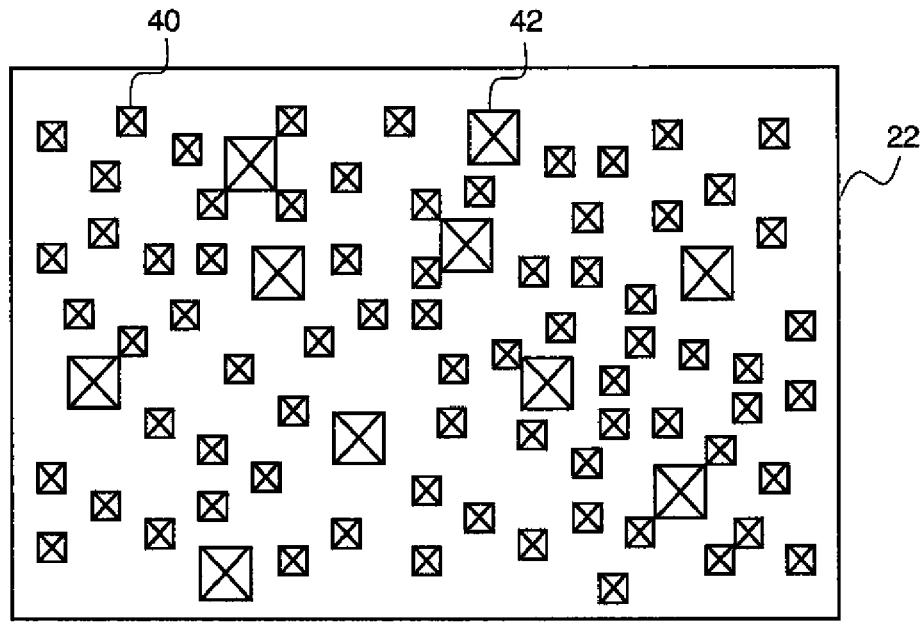
Figure 3:
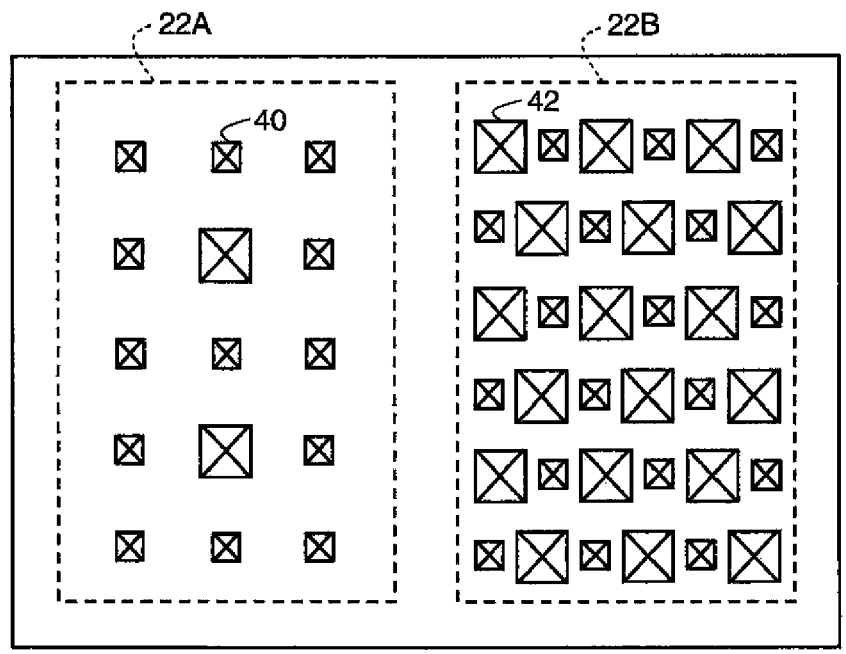
FIG. 3 is a plan view of a distribution of topographical features useful for LED devices according to an alternative embodiment of the present invention.

Referring to FIGS. 2A-2F, the different topographical features of the present invention can be located or distributed in a variety of ways, according to various inventive embodiments. As shown in FIG. 2A, the first topographical features 40 are structurally different from the second topographical features 42 and the first topographical features 40 are intermixed in equal numbers and with a similar distribution with the second topographical features 42 in a single light-emitting area 22. As shown in FIG. 2B, the first topographical features 40 are structurally different from the second topographical features 42 and the first topographical features 40 are intermixed in different numbers and with a different distribution with the second topographical features 42 in a single light-emitting area 22. As shown in FIG. 2C, the first topographical features 40 are structurally different from the second topographical features 42 and the first topographical features 40 are located in a portion 22A different from the portion 22B of the second topographical features 42 but within a single light-emitting area 22. If this embodiment is employed in, for example, a display device, it is preferred that the light-emitting portions 22A and 22B be sufficiently small or viewed at a sufficient distance that the areas cannot be visually distinguished. As shown in FIG. 2D, the first topographical features 40 are structurally similar to the second topographical features 42. However, the first topographical features 40 are located in a portion 22A different from the portion 22B of the second topographical features 42 in a single light-emitting area 22, and have different distributions. As intended in this disclosure, a different distribution of structurally similar features within a single, controllable light-emitting area 22 provides different topographical features. As shown in FIG. 2E, the topographical features 40, 42 can have different shapes, for example portions of a sphere (as shown in FIG. 2E), portions of a pyramid (FIGS. 2A-2D), or portions of a tetrahedron (not shown). As shown in these Figures the first or second topographical features 40, 42, can be circularly symmetric in the plane of the controllable light-emitting area, symmetric in two orthogonal dimensions in the plane of the controllable light-emitting area, have angled walls, have curved walls, have a rectangular cross section in the plane of the light-emitting area, or have an oval cross section (e.g. circular) in the plane of the light-emitting area. As shown in FIG. 2E, the topographical features 40, 42, can have a regular distribution or, as shown in FIG. 2F, the topographical features 40, 42, can have an irregular or random distribution. As shown in FIG. 3, both topographical features 40, 42 can be present in the light-emitting portions 22A, 22B, but in different relative quantities or distribution. The topographical features 40, 42, can have any combination of different distributions, shapes, sizes, thicknesses, projections above a plane, or projections into a plane.

Referring to FIGS. 4A and 4B, the topographical features e.g. 40, 44 can be indented, that is the structure creates a thinner layer, e.g. in insulating layer 32, on which the electrodes 12, 16 and thin-film layer 14 are formed. Alternatively, referring to FIGS. 5A and 5B, the topographical features e.g. 46, 48 can protrude, that is the structure creates a thicker layer, e.g. in insulating or planarizing layer 32, over which the electrodes 12, 16 and thin-film layer 14 are formed. In any of these embodiments, the structure of the topographical features can have straight edges (e.g. FIGS. 4A, 5A) or curved edges (e.g. FIGS. 4B, 5B). Preferably, however, the topographical features 40, 42 have surfaces at an angle that is less than 60 degrees to the plane of the light-emitting area 22, and more preferably have surfaces at an angle that is less than 45 degrees to the plane of the light-emitting area 22. Such a limitation on angle helps to ensure that electrodes 12, 16 do not form an electrical short since materials deposited between the electrodes 12, 16 can be very thin, or not present at all, at sharp points.

Figure 6:
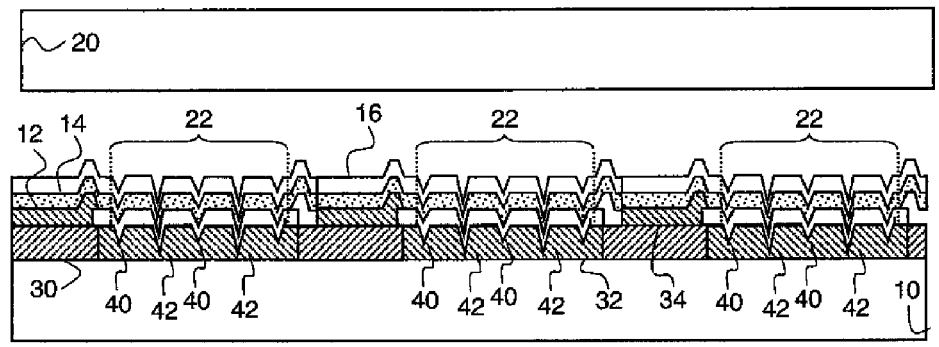
FIG. 6 is a partial cross section of an LED device having a plurality of light-emitting areas according to an embodiment of the present invention.
Figure 7:
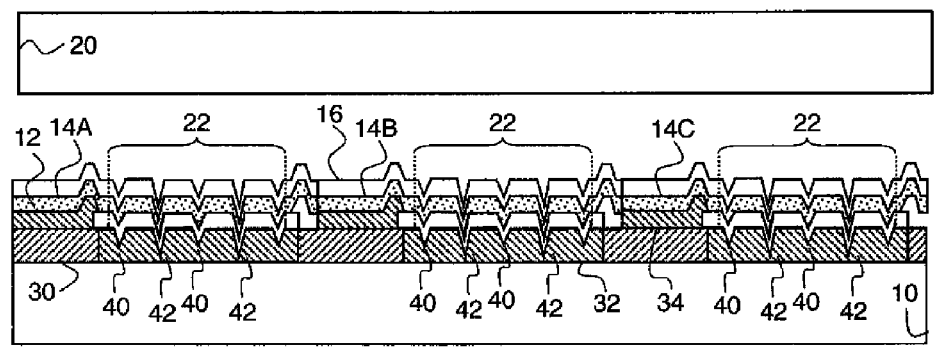
FIG. 7 is a partial cross section of an LED device having a plurality of light-emitting areas according to an alternative embodiment of the present invention.

Referring to FIG. 6 in an embodiment of the present invention, the LED device can include a plurality of light-emitting areas 22. The topographical features 40, 42 within the different light-emitting areas 22 can be different or the same. Referring to FIG. 7, the thin-film light-emitting layers (e.g. 14A, 14B, 14C) can employ different materials (e.g. to emit light with different spectra) and can also employ different thicknesses (e.g. 14C) to provide different optical effects. The electrodes 12, 16 can also have different thicknesses in the different light-emitting areas 22 (not shown) so that that the light-emitting elements 11 have different thicknesses in different light-emitting areas 22. The present invention can be particularly useful in light-emitting areas that emit broadband light. Hence, the topographical features 40, 42, and optical structure of the light-emitting device can emit broadband light in aggregate over the light-emitting area 22 so that a viewer looking at the light-emitting area 22 would perceive a single color of broadband light.

The thin-film LED light-emitting device of the present invention can be constructed by providing a substrate and forming an LED element over the substrate. The LED element includes a transparent or semi-transparent electrode, a reflective electrode, and one or more layers, at least one of which is light emitting, formed between the transparent or semi-transparent electrode and reflective electrode. The transparent or semi-transparent electrode and reflective electrode define a single, controllable light-emitting area and a waveguide into which the LED element emits light. First topographical features and second topographical features different from the first topographical features are formed over the substrate within the single, controllable light-emitting area and disrupt the waveguiding of light within the single, controllable light-emitting area to emit waveguided light that would otherwise be trapped.

The first and second topographical features can be constructed by employing methods known in the art. For example, it has been demonstrated that the use of silicone molds to form structures on a substrate by coating a photosensitive liquid in a mold over the substrate, curing the liquid in the mold, removing the mold, and subsequently evaporatively depositing organic materials and sputtered inorganic materials over the cured structures to form thin-film LED light-emitting devices as described in U.S. Pat. No. 6,831,407 referenced above. Likewise, conventional photolithographic processes for pattern-wise exposing a light-sensitive layer through a mask, developing the pattern, and etching the layer to form structures are described in the paper entitled "Optical Structure of White OLED for 100% Color Gamut" by Lee et al. on p. 245 of the IMID '07 Digest. Alternatively, shadow-masking methods can be employed.

The thin-film light-emitting areas typically correspond to sub-pixel elements in a display, for example, and have areas of 50 microns square or greater. In contrast, photolithographic techniques are well known in the art to achieve resolutions less than one tenth or even one hundredth of that size. Structures have been constructed with dimensions of approximately one micron in size. Inorganic electrode materials (e.g. ITO, silver, aluminum, or metal alloys) are known, as are organic light-emitting materials, for example as used in OLED devices or inorganic materials such as quantum dots in a polycrystalline semiconductor matrix.

As is well known in the prior art, light emitted from within the high-optical-index layers of a thin-film LED device can be trapped between and within a first reflective, transparent, or semi-transparent electrode, a second transparent or semi-transparent electrode, and one or more layers of light-emitting or charge-controlling layers located between the electrodes. Light can also be trapped within the substrate or cover, if transparent. As described in U.S. Pat. No. 6,831,407 by Cok, topographical features located within a light-emitting area can disrupt undesirable waveguiding of trapped light without causing diffraction effects, thereby extracting trapped light and improving the efficiency of the device. However, the extraction and emission of trapped light by employing such topographical features is dependent on various factors. First, trapped light that travels through the waveguide in a direction parallel to the electrodes is absorbed by the electrodes and the light-emitting or charge-controlling layers. Second, the luminance of light emitted from such topographical features tends to be angularly dependent. Third, the frequency of light emitted from such topographical features tends to be angularly dependent.

In a first optical model, an OLED device including a silver, reflective electrode of arbitrary thickness coated with an organic hole-injection-and-transport layer, a light-emitting layer, an electron-injecting-and-transport layer (e.g. Alq, NPB) and a 100 nm thick transparent ITO electrode over a transparent substrate was modeled using the commercially-available Sim3D Finite Difference Time Domain optical modeling tool. This modeling tool solves Maxwell's equations directly for waveguide structures. A thin, 200 Å semi-transparent electrode including MgAg was also modeled in place of the ITO. The charge-management and ITO layers were modeled with n=1.7 optical index, while the substrate was presumed to have an optical index of 1.5. These values are typical of commercially available materials used in the OLED industry. The model was tested at a wavelength of 550 nm for a variety of physical topographical structures, including triangles (as shown in FIGS. 1, 4A, 5A), trapezoids, and various spherical sections, both concave and convex (as shown in FIGS. 4B, 5B). The total reflected, transmitted, and absorbed power was obtained by integrating the normal Poynting vector components over the angular regions of interest associated with the topographical structures.

As demonstrated by the model, the primary loss mechanism for waveguided light is absorption. When tested at different light-emission frequencies (by employing different light-emitting materials having different measured absorption characteristics), the absorption distances can be modeled. Table 1 lists the distance that emitted light of different frequencies travels through the waveguide before one half of the light is absorbed by the waveguide.

TABLE 1

| Color | Red | Green | Blue |
|---|---|---|---|
| Half-Absorption Distance | 20 microns | 10-12 microns | 5 microns |

Figure 10:
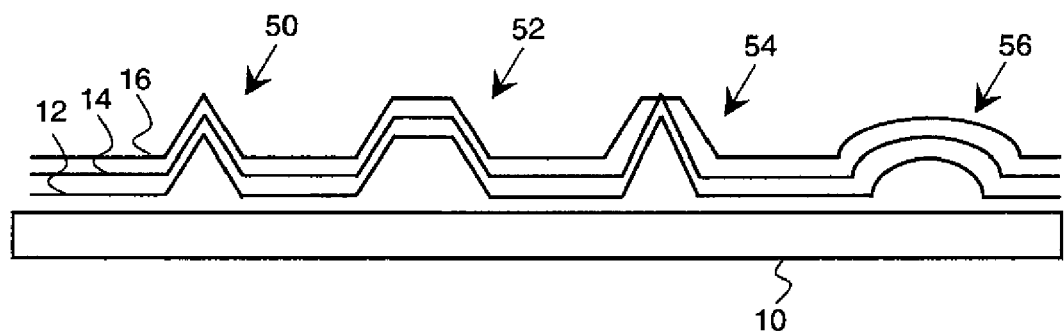
FIG. 10 illustrates various topographical features.

Furthermore, the optical waveguide modeling demonstrates that the structure of the topographical features and the frequency of light influences the amount of light extracted. Table 2 lists the relative extraction efficiency of several topographical features at a wavelength of 550 nm. A 45-degree triangle is a triangle with sides that are at 45 degrees to the waveguide plane as shown in FIGS. 4A, 5A, and 10 (element 50), a 45-degree trapezoid is a trapezoid with sides that are at 45 degrees to the waveguide plane and a top parallel to the waveguide plane (FIG. 10, element 52), a planed triangle is a triangle with sides that are at 45 degrees to the waveguide plane but with a flat top electrode (FIG. 10, element 54), and a 50-degree sphere is a spherical section whose edge is at 50 degrees to the waveguide plane (FIG. 10, element 56). The features were approximately 1 micron in height; each single structure was modeled within a waveguide of approximately 3.5 microns length.

TABLE 2

| Device | 45 triangle | 45 trapezoid | Planed triangle | 50 sphere |
|---|---|---|---|---|
| 550 nm Extraction Efficiency | 78% | 51% | 76% | 78% |

Through optical waveguide modeling of the topographical features, it has been observed that the emission of extracted light is not angularly uniform and is frequency dependent. Extracted light is typically not Lambertian and, especially, is not substantially emitted at a normal to the waveguide plane. Hence, for these reasons, the amount and distribution of light extracted by the topographical features is material dependent, wavelength dependent, structurally dependent, and distribution dependent.

In addition to the extraction and emission dependencies listed, light emitted from an LED device is dependent on the optical structure of the elements forming the LED device. In particular, the optical indices of the light-emitting and charge-controlling materials, the electrodes, a substrate and other layers on which the LED device is formed (for a bottom emitter) or a cover and any overlying layers above the LED device (for a top emitter), especially any low-index layers between the LED device and an encapsulating layer, create optical effects that influence the angular dependence of frequency, luminance, and peak emission wavelength of the emitted light. These effects are particularly problematic for broadband emitters that employ more than one type of light-emitting material (e.g. blue and yellow) to emit, for example, white light. In this case, the optical and topographical feature effects tend to create a problematic frequency dependence on both peak emission and angle of view. These effects will tend to color the light so that it is no longer white and to create an angular dependence for both luminance and frequency.

Figure 8:
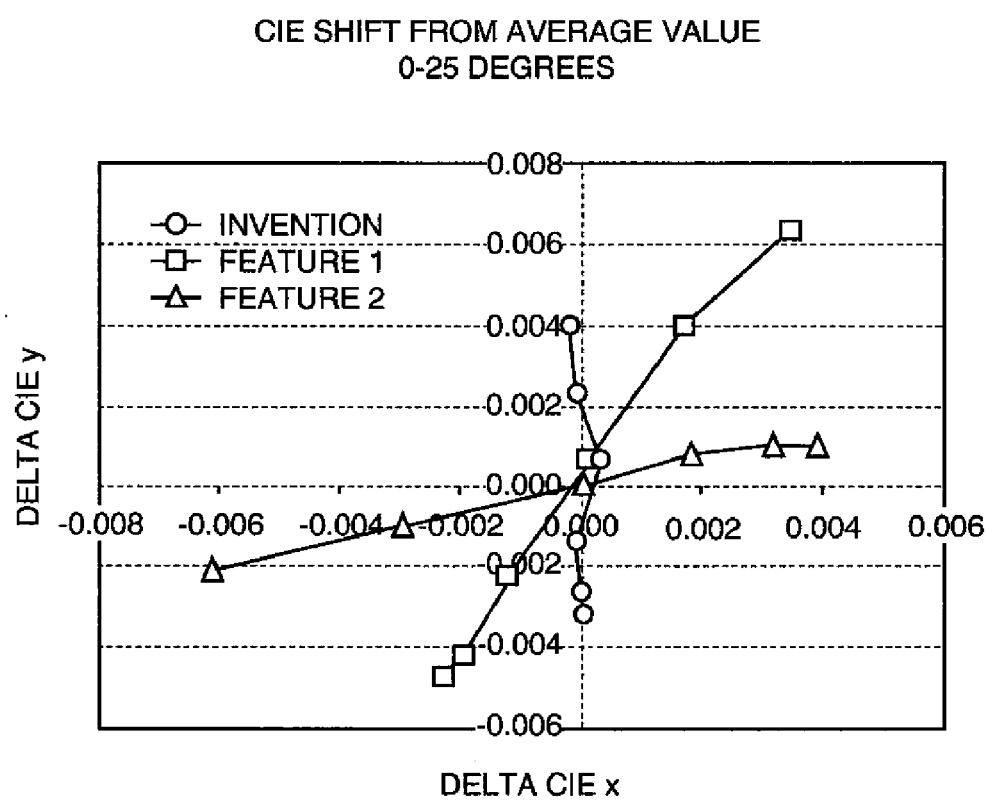
FIG. 8 is a graph illustrating the angular color dependence of light output from a thin-film LED device according to the present invention.
Figure 9:
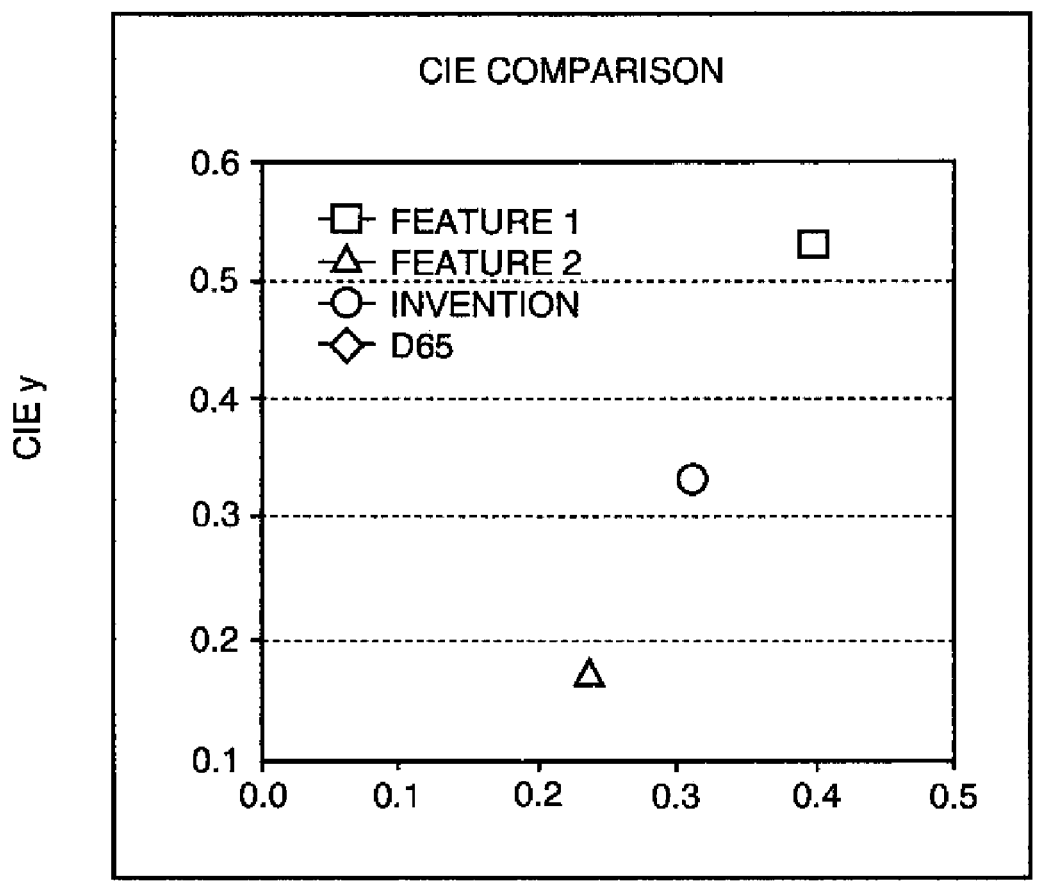
FIG. 9 is a graph illustrating the color of light output from a thin-film LED device according to the present invention.

Advantages of the present invention are demonstrated in the graphs of FIGS. 8 and 9. Referring to the graph of FIG. 8, a bottom-emitting white-light-emitting OLED device having a two-peak spectrum having a blue-light-emitting layer and a yellow-light-emitting layer with hole and electron charge-controlling layers was constructed on a glass substrate with an optical index of 1.5. The light emitting and charge-control layers were chosen to match a D65 white point. A 600 nm ITO absorption reduction layer was deposited on the substrate and a 20 nm semi-transparent silver electrode sputtered over the ITO. 10 nm of NPB was evaporated over the Ag. A 14 nm blue-light-emitting organic layer including a host and a dopant were evaporated and a second 38 nm yellow-lightemitting organic layer including the same host with a different dopant evaporated over the NPB. An organic electron-control layer including Alq in a Bphen host were evaporated at 30 nm and a 7 nm Li layer formed. A 100 nm Al electrode was evaporated over the top to form a second, reflective electrode.

The angular performance of the device was measured and the structure of FIG. 1 modeled using the measured angular data to determine the overall device performance. A first topographical feature had a triangular shape with a 20-degree angle to the substrate in a first portion and a thickness of 235 nm between electrodes. A second topographical feature had a triangular shape with a 20-degree angle to the substrate in a second portion and a thickness of 147 nm between electrodes. The height of the features is not critical but can be 1 to 2 microns. Both portions were covered with the topographical features and the first portion was twice the size of the second portion. Referring to FIG. 8, the change in CIE coordinates from the average for each separate topographical feature is plotted with the combination resulting from the use of the invention. As can be seen from the graph, the change in CIE coordinates is smallest for the invention. Moreover, as shown in Table 3, the invention has the white color closest to the target D65 white point.

TABLE 3

| Device | Feature 1 | Feature 2 | Invention | D65 |
| --- | --- | --- | --- | --- |
| CIE x | 0.1854 | 0.4344 | 0.356 | 0.31 |
| CIE y | 0.1239 | 0.5030 | 0.3839 | 0.33 |

In a second demonstration of the invention, the same materials were employed in two other topographical structures. Both topographical features had a triangular structure and a thickness of 127 nm between the electrodes. The first topographical feature had an angle to the substrate of 31 degrees while the second topographical feature had an angle to the substrate of 57 degrees. Both topographical features covered their respective portions, while the second portion had an area 3.5 times larger than the first portion. Referring to FIG. 9, the CIE coordinates of the light output at the normal are plotted. As can be seen in the graph, the color of the invention is exactly matched to the desired D65 white point, while the individual features have a marked color (yellow and blue, respectively).

Reducing the reflectivity of the semi-transparent electrode (e.g. by employing ITO) can control, to some extent, the magnitude of the color variation between the topographical features. Likewise the performance of such structures has been measured and demonstrates improved performance with the present invention. Furthermore, the light output at the normal for LED structures using more transparent electrodes is reduced. In a bottom-emitter structure, the electrode itself can be patterned using conventional photo-lithographic techniques to include transparent areas (for example in desired white-light-emitting areas) and semi-transparent areas (for example in desired colored-light-emitting areas). However, in a top-emitter structure, the electrode formed over the light-emitting materials must be patterned and such patterning is difficult since conventional photolithographic techniques will destroy delicate OLED materials. While alternative electrode patterning methods can be employed (e.g. shadow-masking), they are limited in size and are relatively costly. Hence, the present invention is particularly advantaged in top-emitter OLED structures using white-light emission (e.g. RGBW designs having red, green, blue, and white light-emitting elements in a pixel).

In operation, the thin-film transistors in TFT layer 30 pass current from one electrode (e.g. 12) through the thin-film layers 14, to the other electrode (e.g. 16) causing one or more of the thin-film layers 14 to emit light. A portion of the light is emitted from the device. Another portion of the light is trapped in the waveguide formed by the electrodes 12, 16, thin-film layers 14, and possibly the substrate 10 or cover 20. When the trapped light encounters the first topographical features 40, the light can be re-directed out of the device with a first frequency distribution and angular dependence. When the trapped light encounters the second topographical features 42, the light can be re-directed out of the device with a second frequency distribution and angular dependence different from the first frequency and angular distribution. The combination of first and second frequency distributions and angular dependencies provides a more stable and uniform output, especially for thin-film layers 14 that emit broadband light. As such, the present invention can be particularly useful in display configurations employing a single broadband emitter with color filters to form primary colors.

The geometry of the topographical features is designed to be effective to disrupt the wave-guiding in the layers of electrodes 16 and 12 or light-emitting thin-film layer 14 and any wave-guiding present in the cover 20 or substrate 10. The layers 12, 14, and 16 together have a typical thickness of 0.1 to 0.4 microns and, preferably, the topographical features have a height of 0.5 micron or more, and preferably a height of one micron or more. Conventional lithographic processes can be used to create the topographical features using, for example, photo-resist, mask exposures, and etching as known in the art. For example, using known photolithographic processes, a patterned layer of silicon dioxide, nitride, or photo-resist can be formed over the substrate 10. A pattern of photo-resist is formed over the layer to define the location of each topographical feature. An etching process is employed to create the topographical features in the layer. The photo-resist pattern is then removed and the electrodes and light emitting layers are deposited over the structured layer. The subsequently deposited layers conform to the topographical features 40, 42.

The spacing of the topographical features 40, 42 within the light-emitting area can be adjusted depending on the absorption of waveguided light by the electrodes 12, 16, and the thin-film layers 14. For example, the blue light can be absorbed most readily, hence the frequency of topographical features can be greater in blue emitting areas to ensure that the light is emitted from the wave-guiding layers before they are absorbed. Generally, the topographical features should be large enough and far enough apart to avoid diffraction effects and a consequent frequency-related angular variation of emission.

The arrangement of the topographical features can also be adjusted in period and in shape. FIGS. 2A-2E illustrate a two-dimensional rectangular grid. Alternatively, a hexagonal arrangement, for example, can be used and has advantages in that a greater area can be surrounded with fewer topographical features providing greater coverage, especially for spherical structures. The topographical features can, but need not be, contiguous.

Generally, the topographical features should be large enough to maintain a non-planar structure as the subsequent layers of electrode 12, thin-film light-emitting material 14, and electrode 16 are deposited. It is not necessary that the top surface of the top electrode layer 16 maintain the exact shape of the underlying structure. Hence, the electrode layer 16 might be thicker than the other layers and can also function as a planarizing layer in the device (in a bottom-emitting structure).

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

The present invention can be practiced with either active- or passive-matrix OLED devices, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, to Tang et al., and U.S. Pat. No. 5,061,569, to Van Slyke et al. Inorganic devices, for example, employing quantum dots formed in a polycrystalline semiconductor matrix (for example, as taught in U.S. Patent Application Publication 2007/0057263 by Kahen), and employing organic or inorganic charge-control layers, or hybrid organic/inorganic devices can be employed. Many combinations and variations of organic or inorganic light-emitting displays can be used to fabricate such a device, including both active- and passive-matrix displays having either a top- or bottom-emitter architecture.

The invention has been described in detail with particular reference to certain preferred embodiments thereof but it will be understood that variations and modifications can be effected within the spirit and scope of the invention.

PARTS LIST

| | |
|---|---|
| 10 | substrate |
| 11 | LED element |
| 12 | electrode |
| 13 | waveguide |
| 14 | thin-film light-emitting layer(s) |
| 14A | thin-film light-emitting layer(s) |
| 14B | thin-film light-emitting layer(s) |
| 14C | thin-film light-emitting layer(s) |
| 16 | electrode |
| 20 | cover |
| 22 | single, controllable light-emitting area |
| 22A | portion of single, controllable light-emitting area |
| 22B | portion of single, controllable light-emitting area |
| 30 | thin-film electronic components |
| 32 | insulating layer |
| 34 | insulating layer |
| 40 | topographical feature |
| 42 | topographical feature |
| 44 | topographical feature |
| 46 | topographical feature |
| 48 | topographical feature |
| 50 | triangle |
| 52 | trapezoid |
| 54 | planed triangle |
| 56 | 50-degree hemisphere |

The invention claimed is:

1. A light-emitting device, comprising:
   (a) a substrate;
   (b) a plurality of LED elements formed over the substrate, each LED element including a transparent or semi-transparent electrode, a reflective electrode, and one or more layers, at least one of which is light-emitting, formed between the transparent or semi-transparent electrode and reflective electrode, the transparent or semi-transparent electrode and reflective electrode defining a single, controllable light-emitting area, whereby the plurality of LED elements comprise a plurality of different light-emitting materials, wherein the plurality of LED elements emit light into a waveguide defined by the respective transparent or semi-transparent electrode, reflective electrode, and the one or more layers; and
   (c) one or more first topographical features and one or more second topographical features different from the first topographical features formed over the substrate throughout at least one LED element, and within a single, controllable light-emitting area, wherein the first and second topographical features disrupt the waveguiding of light within the single, controllable light-emitting area to increase the emission of light in at least one direction, and wherein the first or second topographical features are either indentations or extrusions.

2. The light-emitting device according to claim 1, wherein the light-emitting device is a display device having a plurality of individually addressable light emitting pixels and the single, controllable light-emitting area is a sub-pixel.

3. The light-emitting device according to claim 1, wherein the light-emitting layers comprise one or more light-emitting organic layers, or one or more light-emitting layers having one or more inorganic layers having quantum dots within a polycrystalline semiconductor matrix.

4. The light-emitting device according to claim 1, wherein the LED element forms a microcavity.

5. The light-emitting device according to claim 1, wherein the single, controllable light-emitting area is divided into at least first and second portions, the first topographical features formed within the first portion and the second topographical feature formed within the second portion.

6. The light-emitting device according to claim 1, wherein the first and second topographical features are intermixed within the single, controllable light-emitting area.

7. The light-emitting device according to claim 1, wherein the first and second topographical features have the same shape but differ in their distribution over an area, have different shapes, or have different shapes and differ in their distribution over an area.

8. The light-emitting device according to claim 1, wherein the first or second topographical features are circularly symmetric in the plane of the controllable light-emitting area, are symmetric in two orthogonal dimensions in the plane of the controllable light-emitting area, have angled walls, have curved walls, have a rectangular cross section in the plane of the light-emitting area, or have an oval cross section in the plane of the light-emitting area.

9. The light-emitting device according to claim 1, wherein the first or second topographical features are located in an irregular pattern.

10. The light-emitting device according to claim 1, wherein the first or second topographical features in a first light-emitting area are different in shape, distribution, or shape and distribution from the first or second topographical features in a second light-emitting area.

11. The light-emitting device according to claim 1, wherein the LED element in a first light-emitting area has a different thickness than the thickness of an LED element in a second light-emitting area.

12. The light-emitting device according to claim 1, wherein the topographical features are distributed rectangularly or hexagonally in the light light-emitting area.

13. The light-emitting device according to claim 1, wherein the one or more layers emit broadband light.

14. The light-emitting device according to claim 1, wherein the LED device is an area illumination lamp or a display.

15. The light-emitting device according to claim 1, wherein the topographical feature is defined by a feature in an insulating layer located under the light emitting layer.

16. The light-emitting device according to claim 1, wherein the topographical features have surfaces at an angle that is less than 45 degrees to the plane of the light-emitting area.

17. A light-emitting device, comprising:
 (a) a substrate;
 (b) a plurality of LED elements formed over the substrate, each LED element including a transparent or semi-transparent electrode, a reflective electrode, and one or more layers, at least one of which is light-emitting, formed between the transparent or semi-transparent electrode and reflective electrode, the transparent or semi-transparent electrode and reflective electrode defining a single, controllable light-emitting area, whereby the plurality of LED elements comprise a plurality of the light-emitting materials, wherein the plurality of LED elements emit light into a waveguide defined by the respective transparent or semi-transparent electrode, reflective electrode, and the one or more layers; and
 (c) one or more first topographical features and one or more second topographical features different from the first topographical features formed over the substrate throughout at least one LED element, and within a single, controllable light-emitting area,
wherein the first and second topographical features disrupt the waveguiding of light within the single, controllable light-emitting area to increase the emission of light in at least one direction, and
wherein the first and second topographical features are large enough to maintain a non-planar structure as the layers in the LED element are deposited.

* * * * *